(12) United States Patent
Lin et al.

(10) Patent No.: US 11,476,101 B1
(45) Date of Patent: Oct. 18, 2022

(54) DOUBLE-LAYER SHIELDING DEVICE AND THIN-FILM-DEPOSITION EQUIPMENT WITH THE SAME

(71) Applicant: SKY TECH INC., Hsinchu County (TW)

(72) Inventors: Jing-Cheng Lin, Hsinchu County (TW); Yu-Te Shen, Hsinchu County (TW)

(73) Assignee: SKY TECH INC., Hsinchu County (TW)

(*) Notice: Subject to any disclaimer, the term of this patent is extended or adjusted under 35 U.S.C. 154(b) by 0 days.

(21) Appl. No.: 17/497,535

(22) Filed: Oct. 8, 2021

(30) Foreign Application Priority Data

Jul. 16, 2021 (TW) .................................. 110126322

(51) Int. Cl.
*H01J 37/34* (2006.01)
*C23C 14/34* (2006.01)

(52) U.S. Cl.
CPC .......... *H01J 37/3441* (2013.01); *C23C 14/34* (2013.01); *H01J 37/3447* (2013.01); *H01J 2237/332* (2013.01)

(58) Field of Classification Search
CPC ............... H01J 37/3447; H01J 37/3441; H01J 37/32651; H01J 2237/332; C23C 14/34
USPC ................................................. 204/298.11
See application file for complete search history.

(56) References Cited

U.S. PATENT DOCUMENTS

| | | | |
|---|---|---|---|
| 6,511,585 B1* | 1/2003 | Shi .................... | H01J 37/32055 118/723 VE |
| 7,033,461 B2* | 4/2006 | Tani ...................... | C23C 14/545 204/192.12 |
| 2011/0147199 A1* | 6/2011 | Ohishi .................... | C23C 14/34 204/192.12 |

* cited by examiner

*Primary Examiner* — Rodney G McDonald
(74) *Attorney, Agent, or Firm* — Chun-Ming Shih; HDLS IPR Services

(57) ABSTRACT

The present disclosure provides a thin-film-deposition equipment with double-layer shielding device, which includes a reaction chamber, a carrier and a double-layer shielding device. The double-layer shielding device includes a first-shield member, a second-shield member, a first-guard plate, a second-guard plate and a driver. The first-guard plate is disposed on the first-shield member, the second-guard plate is disposed on the second-shield member. The driver interconnects the two shield members for driving and swinging the two shield members to move in opposite directions. During a cleaning process, the driver swings the two shield members toward each other into a shielding state for covering the carrier, the two guard plates thereon also approach each other to cover the shield members, such that to effectively prevent polluting the carrier during the process of cleaning the thin-film-deposition equipment.

20 Claims, 13 Drawing Sheets

DOUBLE-LAYER SHIELDING DEVICE AND THIN-FILM-DEPOSITION EQUIPMENT WITH THE SAME

TECHNICAL FIELD

The present disclosure relates to a double-layer shielding device and a thin-film-deposition equipment with the same, which mainly employ shield members to cover a substrate carrier, in order to prevent polluting the carrier during a process of cleaning the reaction chamber.

BACKGROUND

Thin-film-deposition equipments, such as chemical-vapor deposition (CVD), physical-vapor deposition (PVD) and the atomic-layer deposition (ALD) equipments, those are commonly employed in manufacturing process of semiconductors, light-emitting diodes and displays, etc.

A thin-film-deposition equipment mainly includes a chamber and a substrate carrier, wherein the substrate carrier is within the chamber for carrying at least one substrate. To exemplify by PVD, a target material is required to dispose within the chamber, wherein the target material faces the substrate on the substrate carrier. When performing PVD, noble gas or reactive gas is transferred into the chamber, then bias electricity is applied on the target material and the substrate carrier respectively, also the substrate carried on by the substrate carrier is heated up.

The noble gas or reactive gas within the chamber transforms into ionized gas in effect of a high-voltage electric field, then the ionized gas is attracted by the bias electricity to bombard the target material. Thereby, atoms or molecules splashed from the target material are attracted by the bias electricity on the substrate carrier, then be deposited on surface of the substrate and forms a thin film on the surface of the substrate.

After some time of usage, an inner-edge surface of the chamber may also be formed with thin film, then a periodic cleaning is required to perform to the chamber, in order to prevent the waste thin film from dropping onto the substrate and causing pollution during the process of thin-film deposition. Moreover, surface of the target material may be formed with oxide or other pollutant, therefore requires a periodic cleaning as well. Generally, a burn-in process is applied to bombard the target material within the chamber by plasma ions, then to remove the oxides or pollutants on the surface of target material.

To perform the abovementioned cleaning process, the substrate carrier and the substrate must be extracted or kept out, to prevent the removed pollutant from turning to pollute the substrate carrier and the substrate, during the cleaning process.

SUMMARY

Generally, after some time of usage, the thin-film-deposition equipment is required for cleaning, in order to remove the waste thin film within the chamber and the oxide or nitride on the target material. During the cleaning process, some removed pollutant particles may turn to pollute the substrate carrier, thus there is a need to keep out the substrate carrier (carrier) from the removed pollutant. The present disclosure provides a double-layer shielding device and a thin-film-deposition equipment with the same, which mainly employs a driver to rotate and swing two shield members in opposite angular directions to approach or leave each other, such that to operate between a shielding state and an open state. Thereby, the shield members in shielding state can cover and shield the substrate carrier, to prevent the removed pollutant particles from turning to pollute the substrate carrier during the process of cleaning the chamber or the target material.

An object of the present disclosure is to provide a thin-film-deposition equipment with double-layer shielding device, which includes a reaction chamber, a carrier and a shielding device. The shielding device includes a driver, two shield members and two guard plates, wherein the driver interconnects and swings the shield members to move in opposite angular directions, such that to operate the shield members between an open state and a shielding state. Moreover, the two guard plates are respectively disposed on the two shield members, and hence positioned between the two shield members and the target material.

During a process of cleaning the reaction chamber, the driver swings the two shield members to approach each other, such that the two shield members come together to cover the carrier within a containing space, in order to prevent a plasma employed to proceed the cleaning or some removed waste pollutant from turning to pollute the substrate carrier and/or the substrate thereon. Alternatively, during a process of performing the deposition, the driver swings the two shielding members to leave each other, such that to permit the process to proceed on the substrate within the reaction chamber.

An object of the present disclosure is to provide a thin-film-deposition equipment with shielding device, which employs two shield members that can combine to form a whole shield, thereby to improve space efficiency. In one embodiment, the two shield members sway in opposite angular directions within the containing space of the reaction chamber, wherein the two are operable between an open state and a shielding state within the reaction chamber, such that to improve space efficiency of the reaction chamber.

Furthermore, the two shield members can approach each other to form a whole shield for a full coverage of the carrier against the pollutants. Therewith, the two guard plates also approach each other to cover and protect the two shield members. Moreover, the two guard plates and the two shield members have a gap therebetween, for preventing high-temperature matters and some heat directly transferring from the two guard plates to the two shield members during the cleaning process, such that to prevent thermal deformation of the shield members.

An object of the present disclosure is to provide a thin-film-deposition equipment with double-layer shielding device, wherein the first-shield member and the second-shield member have a first gap space therebetween, the first-guard plate and the second-guard plate have a second gap space therebetween, and moreover the first gap space and the second gap space do not spatially overlap. Such that, the pollutants created during the cleaning process are prevented from straightly passing the first gap space and the second gap space and then contact the carrier.

To achieve the abovementioned object, the present disclosure provides a thin-film-deposition equipment, which includes a reaction chamber that has a carrier within the containing space for carrying at least one substrate; and a double-layer shielding device. The double-layer shielding device comprising: a first-shield member that is disposed within the containing space; a first-guard plate that is disposed on a surface of the first-shield member; a second-shield member that is disposed within the containing space; a second-guard plate that is disposed on a surface of the second-shield member; and a driver that interconnects and drives the first-shield member and the second-shield member to respectively sway and move the first-shield member and the second-shield member in opposite directions between an open state and a shielding state, wherein in the shielding state, the first-shield member and the second-shield member approach each other to cover the carrier, therewith the first-guard plate and the second-guard plate also approach each other to protect the first-shield member and the second-shield member.

The present disclosure also provides a double-layer shielding device, which is adapted to thin-film-deposition equipment, and includes: a first-shield member; a first-guard plate that is disposed on a surface of the first-shield member; a second-shield member; a second-guard plate that is disposed on a surface of the second-shield member; and a driver that interconnects and drives the first-shield member and the second-shield member to respectively sway and move the first-shield member and the second-shield member in opposite directions between an open state and a shielding state, wherein in the shielding state, the first-shield member and the second-shield member approach each other, therewith the first-guard plate and the second-guard plate also approach each other to protect the first-shield member and the second-shield member.

Another object of the present disclosure is to provide the abovementioned shielding device and thin-film-deposition equipment, wherein each of the two shield members has a surface facing each other and respectively disposed with a cavity and a protrusion. The driver drives and swings the two shield members to approach each other, wherein the protrusion on one of the shield member is inserted into the cavity on another one of the shield member, such that the two shield members form a whole shield.

To achieve the abovementioned object, the present disclosure provides the aforementioned shielding device, wherein: the first-shield member includes a first-inner-edge surface formed with at least one protrusion; the second-shield member includes a second-inner-edge surface formed with at least one cavity corresponding to the protrusion of the first-inner-edge surface.

Another object of the present disclosure is to provide the abovementioned shielding device and thin-film-deposition equipment, wherein the shielding device includes two drivers respectively connected to the two shield members.

To achieve the abovementioned object, the present disclosure provides the aforementioned shielding device, wherein the driver includes: a first driver connected to the first-shield member; and a second driver connected to the second-shield member, wherein the first driver and the second driver respectively drive and swing the first-shield member and the second-shield member in the opposite directions, thereby the first-shield member and the second-shield member are switchable between the open state and the open state.

BRIEF DESCRIPTION OF THE DRAWINGS

The structure as well as preferred modes of use, further objects, and advantages of this present disclosure will be best understood by referring to the following detailed description of some illustrative embodiments in conjunction with the accompanying drawings, in which.

DETAILED DESCRIPTION OF THE PREFERRED EMBODIMENTS

Figure 1:
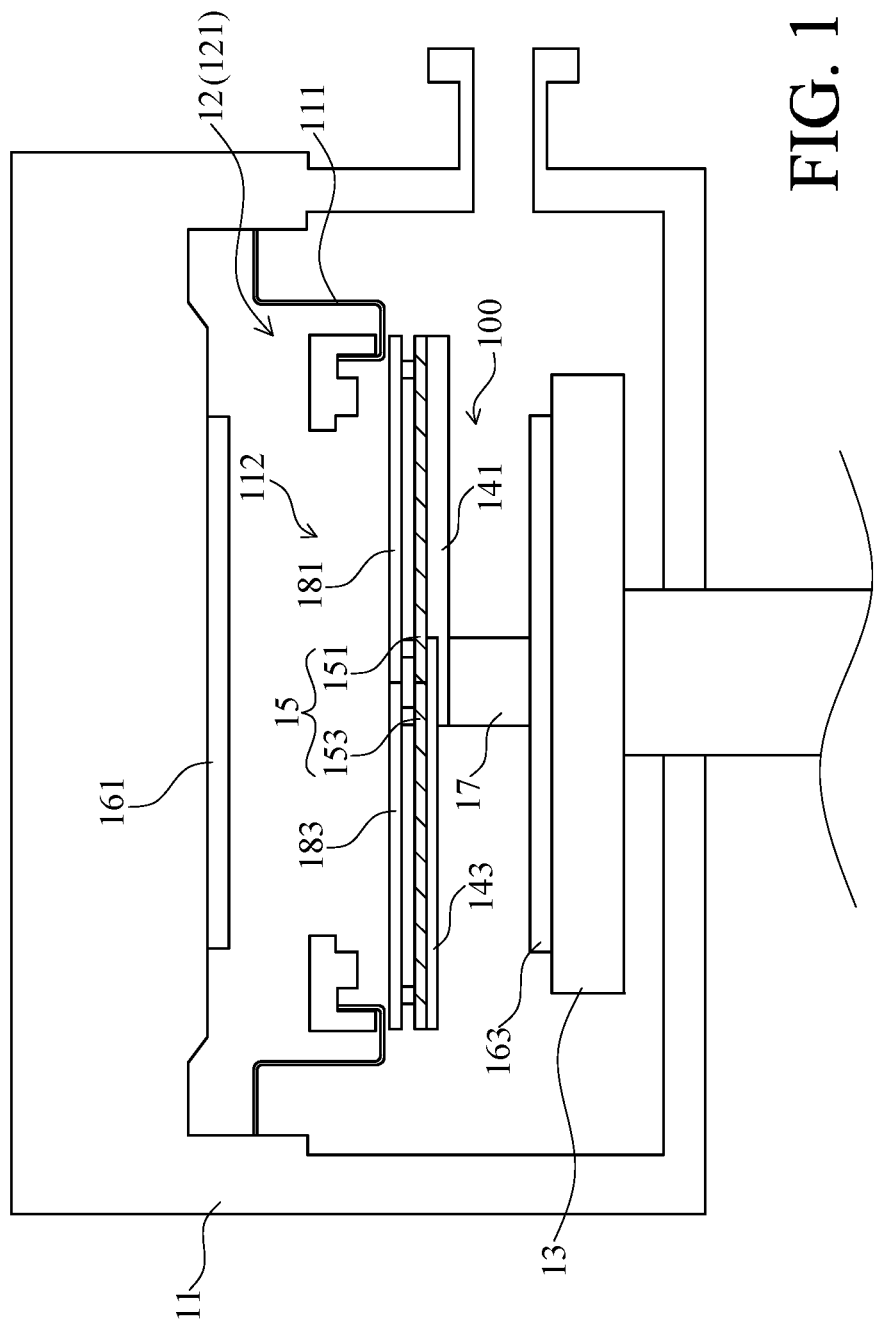
FIG. 1 is a schematic sectional view illustrating a double-layer shielding device of a thin-film-deposition equipment which is operated in a shielding state, according to one embodiment of the present disclosure.

Referring to FIG. 1, which is a schematic sectional view illustrating a double-layer shielding device 100 of a thin-film-deposition equipment 10 which is operated in a shielding state, according to one embodiment of the present disclosure. As shown in the FIG., the thin-film-deposition equipment 10 main includes a reaction chamber 11, a carrier 13 and a double-layer shielding device 100 (hereafter as "shielding device"), wherein the reaction chamber 11 includes a containing space 12 for containing the carrier 13 and a portion of the shielding device 100.

The carrier 13 is positioned within the containing space 12 of the reaction chamber 11, for carrying at least one substrate (not shown). In this embodiment, the thin-film-deposition equipment 10 is exemplified as a physical-vapor deposition chamber. The reaction chamber 11 is disposed within a target material 161 and has the target material 161 facing the carrier 13. Specifically, the target material 161 may be disposed on a ceiling surface of the reaction chamber 11 to face the carrier 13 and/or the substrate carried thereon within the containing space 12, for example.

Figure 2:
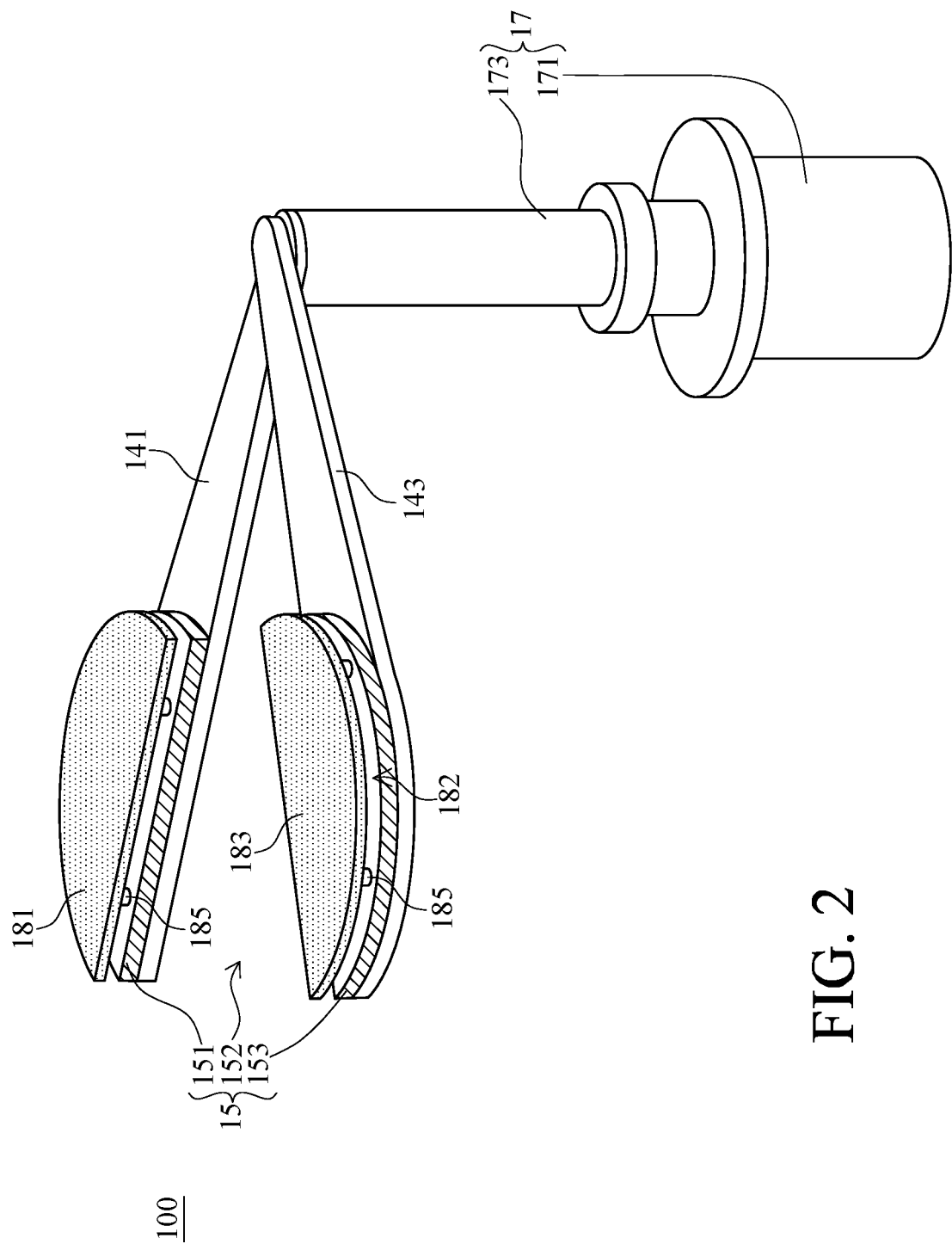
FIG. 2 is a schematic perspective view illustrating the shielding device which is operated in an open state, according to one embodiment of the present disclosure.
Figure 3:
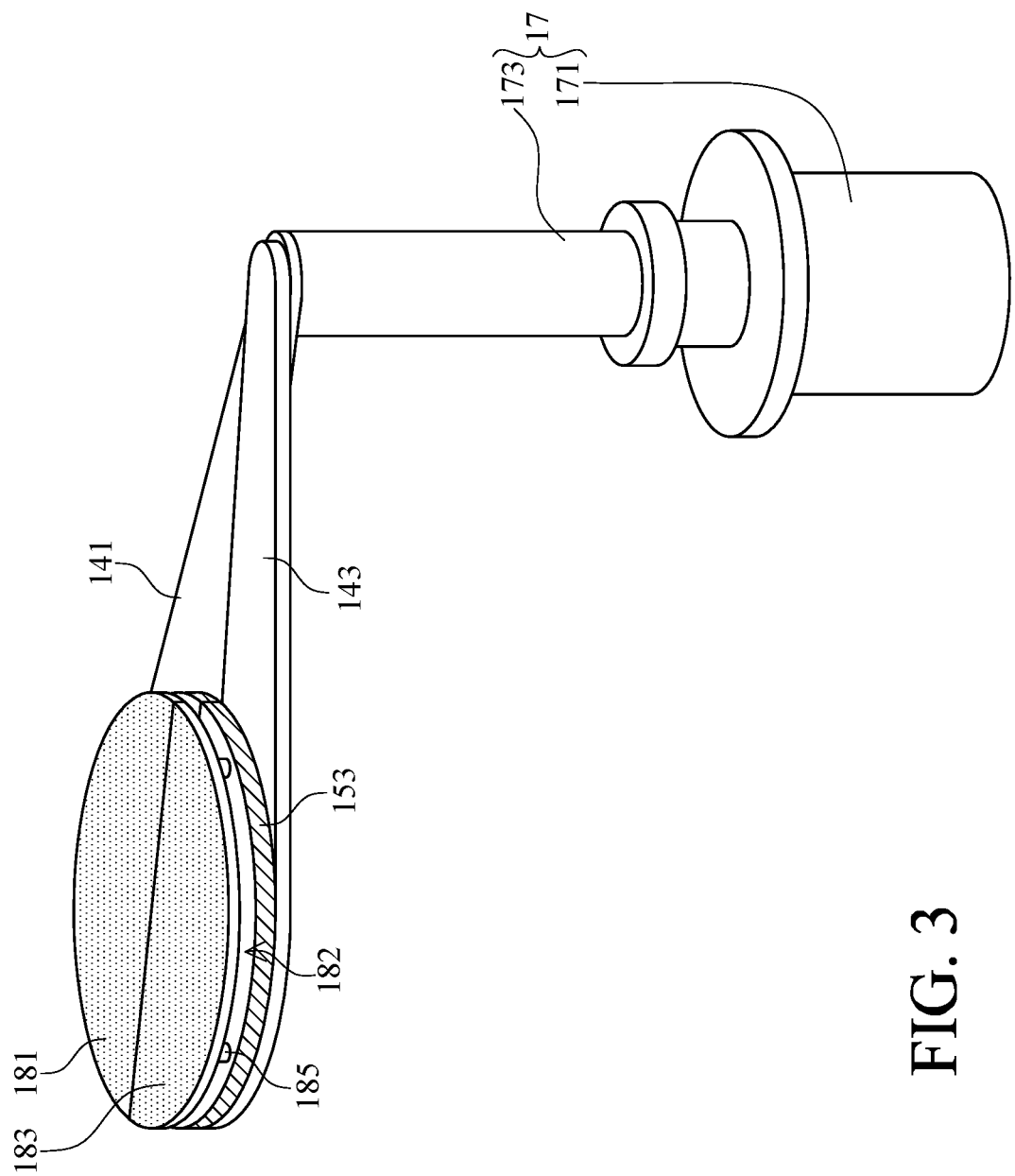
FIG. 3 is a schematic perspective view illustrating the shielding device which is operated in the shielding state, according to one embodiment of the present disclosure.

Referring to FIG. 2 and FIG. 3, the shielding device 100 includes a first-shield member 151, a second-shield member 153, a first-guard plate 181, a second-guard plate 183, and a driver 17, wherein the two shield members 151, 153 and the two guard plates 181, 183 are all positioned within the containing space 12.

The driver 17 interconnects the first-connecting arm 141 and the second-connecting arm 143, wherein the first-connecting arm 141 and the second-connecting arm 143 are for respectively carrying the first-shield member 151 and the second-shield member 153. With such structure, the driver 17 drives, swings the first-shield member 151 and the second-shield member 153 in opposite angular directions via the first-connecting arm 141 and the second-connecting arm 143, such as to have the first-shield member 151 and the second-shield member 153 swaying toward or away from each other synchronously, about an axle of the driver 17.

In one embodiment of the present disclosure, the double-layer shielding device 100 further includes a first-connecting arm 141 and a second-connecting arm 143. The driver 17 is power-transmittably connected to the first-shield member 151 via the first-connecting arm 141, and also power-transmittably connected to the second-shield member 153 via the second-connecting arm 143. Such that, the driver 17 drives and swings the two connecting arms 181, 183, to further move the two shield members 151, 153 with the guard plates 181, 183 thereon in the opposite directions, and such that the two shield members 151, 153 can be operated to switch between a shielding state and open state.

The first-shield member 151 and the second-shield member 153 may be formed as plates with similar shapes, such as respectively formed as one half and another half of a round plate. Such that, the driver 17 swings the first-connecting arm 141 and the second-connecting arm 143 to respectively move the first-shield member 151 and the second-shield member 153 toward each other, the two members 151, 153 come together and form a whole round shield 15, for covering and shielding the carrier 13 and/or the substrate thereon.

To be specific, as shown in FIG. 1, each of the shield members 151, 153 has a surface (upside of FIG. 1) facing the target material 161 as a top surface, and another surface (downside of FIG. 1) facing the carrier 13 as a bottom surface. The first-guard plate 181 is disposed on the top surface of the first-shield member 151, in the other hand, the second-guard plate 183 is disposed on the top surface of the second-shield member 153. Such that, when the shielding device 100 is in the shielding state, the two guard plates 181, 183 are positioned between the two shield members 151, 153 and the target material 161.

With such structure, as the driver 17 drives, swings the connecting arms 141, 143 to move the two shield members 151, 153 toward each other into the shielding state, the first-guard plate 181 and the second-guard plate 183 also come together to get between the shield members 151, 153 and the target material 161, to provide further coverage and protection for the shield members 351, 353.

The guard plates 181, 183 mainly serve to block the high-temperature matters or the heat created during the process of cleaning the reaction chamber 11 and the target material 161, from directly contacting the shield members 351, 353, such that to prevent thermal deformation and malicious effect occurring thereto.

Moreover, a manner of the first-shield member 151 and the second-shield member 153 being operated into the shielding state, which is defined as the first-shield member 151 and the second-shield member 153 continue to approach each other, until a distance between the two members 151, 153 is less than a threshold value, such as 1 millimeter (mm). Therewith, the first-guard plate 181 and the second-guard plate 183 also continue to approach each other, until a distance therebetween is less than the threshold value. To be specific, the first-shield member 151 and the second-shield member 153 do not actually contact each other, and so do the first-guard plate 181 and the second-guard plate 183, such that to avoid a collision or friction therebetween, which may create some wear-off particles therefrom to pollute the containing space 12 of the reaction chamber 11 and/or the carrier 13 therein.

Figure 6:
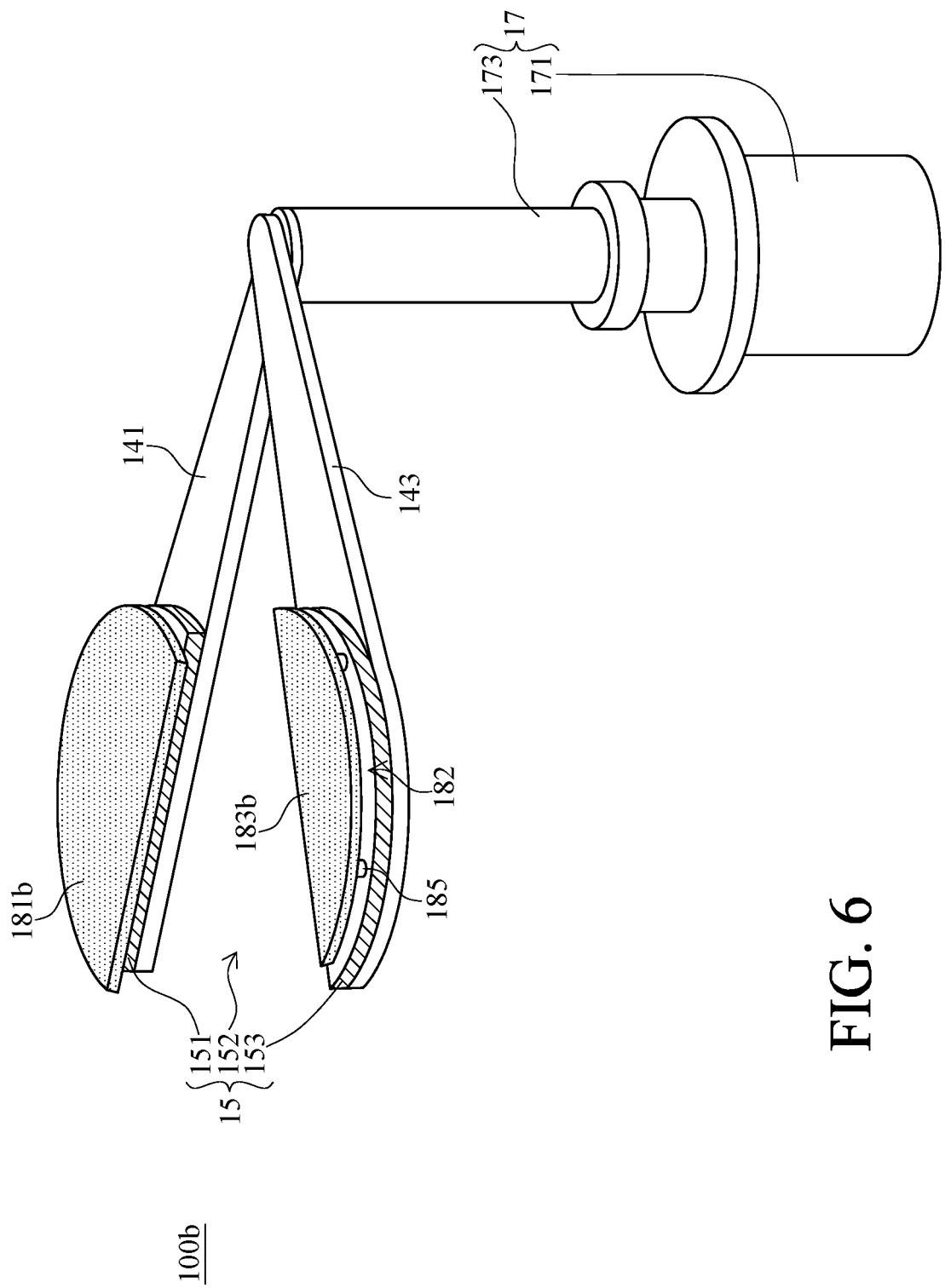
FIG. 6 is a schematic perspective view illustrating the shielding device which is operated in the open state, according to another different embodiment of the present disclosure.

As shown in FIG. 2, FIG. 3 and FIG. 6, in one embodiment of the present disclosure, the guard plates 181, 183 are connected to the shield members 151, 153 via a plurality of support units 185, and thereby a gap 182 is respectively formed between the first-guard plate 181 and the first-shield member 151, and between the second-guard plate 183 and the second-shield member 153. The gaps 182 can serve prevent the high temperature generated during the cleaning process from directly transferring from the guard plates 181, 183 into the shield members 151, 153, such that to further prevent the thermal deformation of the shield members 151, 153.

Figure 7:
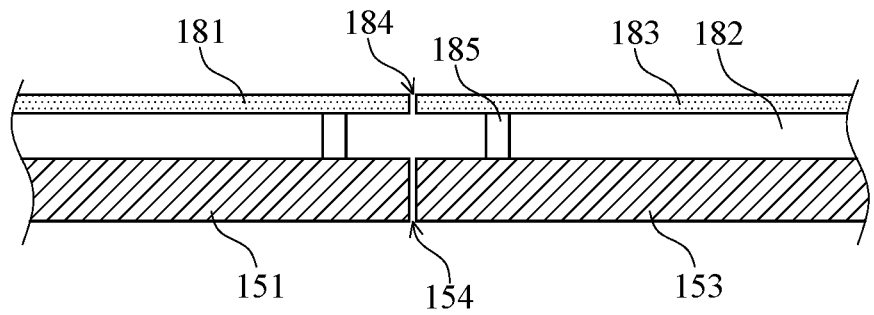
FIG. 7 is a schematic fragmentary sectional view illustrating two shield members and two guard plates of the shielding device which are operated in the shielding state, according to one embodiment of the present disclosure.

Also as shown in FIG. 7, when the shield members 151, 153 are in the shielding state, the two shield members 151, 153 maintain a first gap space 154 therebetween, the two guard plates 181, 183 also maintain a second gap space 184 therebetween, wherein the first gap space 154 and the second the gap space 184 have some spatial overlap, in this embodiment. Moreover, the first-shield member 151 and the first-guard plate 181 both may be formed with similar half-round shapes and area sizes, in the hand, the second-shield member 153 and the second-guard plate 183 both are formed with similar half-round shapes corresponding to that of the first-shield member 151 and the first-guard plate 181. With such shapes, when in the shielding state, the two shield members 151, 153 can form the whole round shield 15, therewith the two guard plates 181 are also operated in a manner similar thereto.

Surely, in other embodiment, the shield members 151, 153 may be formed in different geometric shapes, such as rectangular shapes, or triangular shapes, etc. Along therewith, the guard plates 181, 183 may also be formed in any geometric shapes.

Figure 4:
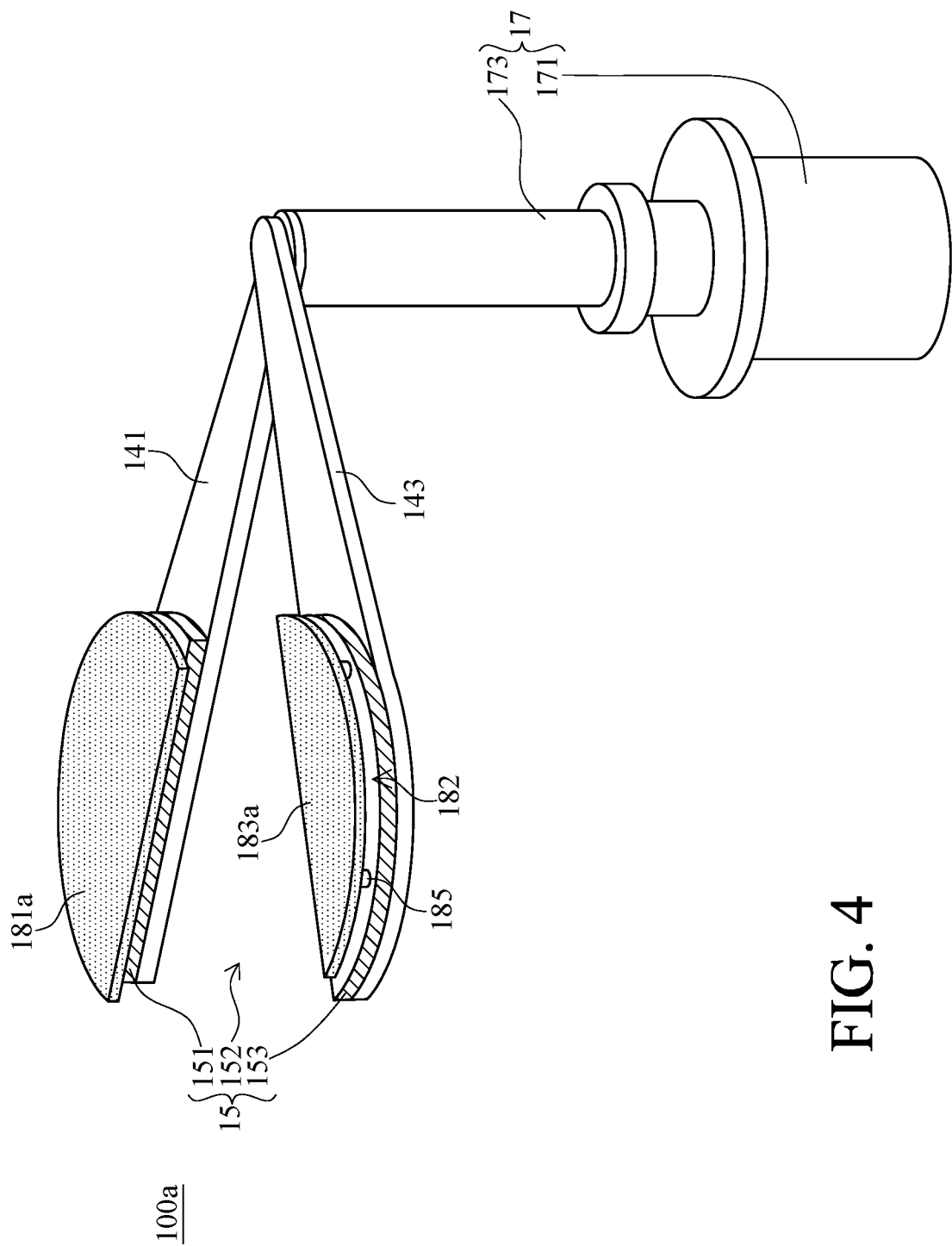
FIG. 4 is a schematic perspective view illustrating the shielding device which is operated in the open state, according to a different embodiment of the present disclosure.
Figure 5:
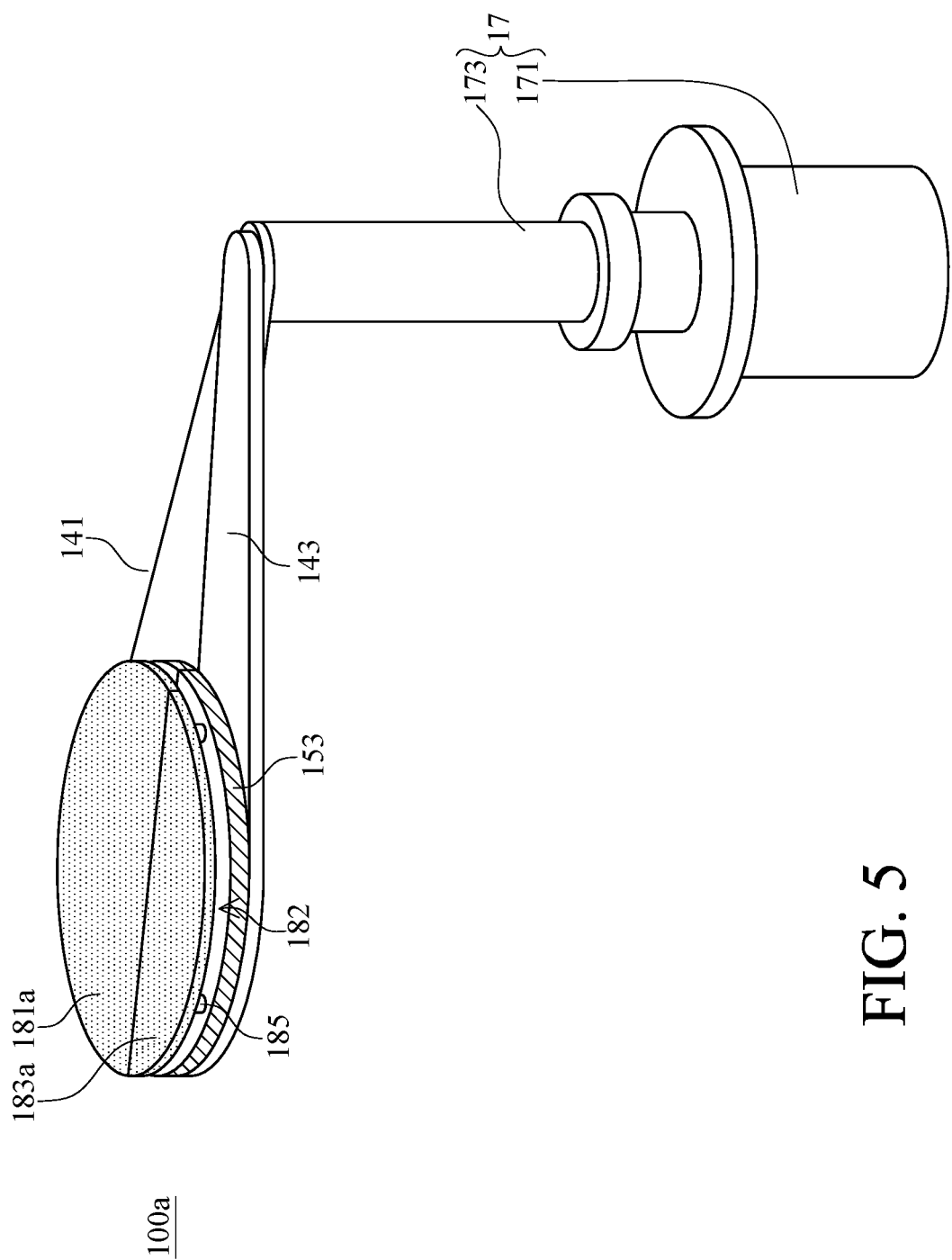
FIG. 5 is a schematic perspective view illustrating the shielding device which is operated in the shielding state, according to a different embodiment of the present disclosure.
Figure 8:
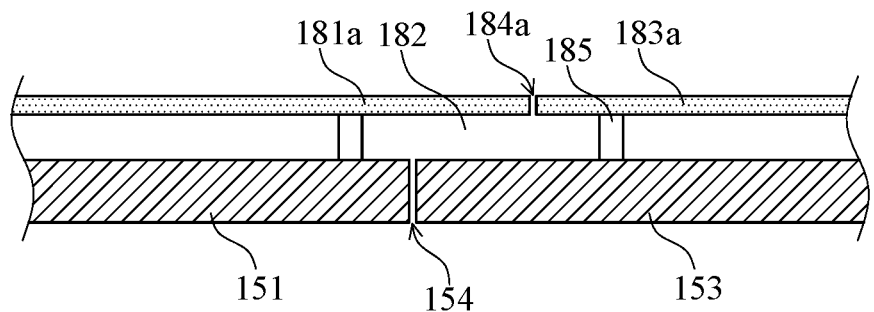
FIG. 8 is a schematic fragmentary sectional view illustrating two shield members and two guard plates of the shielding device which are operated in the shielding state, according to a different embodiment of the present disclosure.

In different embodiment of the present disclosure, as shown in FIG. 4, FIG. 5 and FIG. 8, the guard plates 181a, 183a and the shield members 151, 153 may be configured to have the first gap space 154a and the second gap space 184a not spatially overlap each other. In this embodiment, the two shield members 151, 153 have substantially identical area sizes, whereas the two guard plates 181a, 183a have different area sizes, such as the first-guard plate 181a may be formed larger than the second-guard plate 183a. However surely, in practical use, it may also be configured into an opposite manner, such as the two shield members 151, 153 have different area sizes, whereas the two guard plates 181a, 183a have substantially identical area sizes, thereby no spatial overlap between the first gap space 154a and the second gap space 184a as well.

When the first gap space 154a has no spatial overlap with the second gap space 184a, the high-temperature matters and the heat of the cleaning process is prevented from directly passing through the second gap space 184 then the first gap space 154, and then to reach the carrier 13, thereby to improve the coverage for the carrier 13 and/or the substrate.

In a different embodiment of the present disclosure, first-shield member 151 and the second-shield member 153 may be positioned in different heights, therewith the first-guard plate 181 and the second-guard plate 183 thereon may also be disposed in different heights, such as to have the first-shield member 151 positioned higher than the second-shield member 153, with the first-guard plate 181 also positioned higher than the second-guard plate 183. Such that, when in the shielding state, the first-shield member 151 partially covers the top surface of the second-shield member 153 and hence overlaps therewith, the first-guard plate 181 also partially covers a top surface (such as upside of FIG. 7) of the second-guard plate 183 and overlaps therewith, thereby to improve the coverage for the carrier 13 and/or the substrate thereon.

Figure 9:
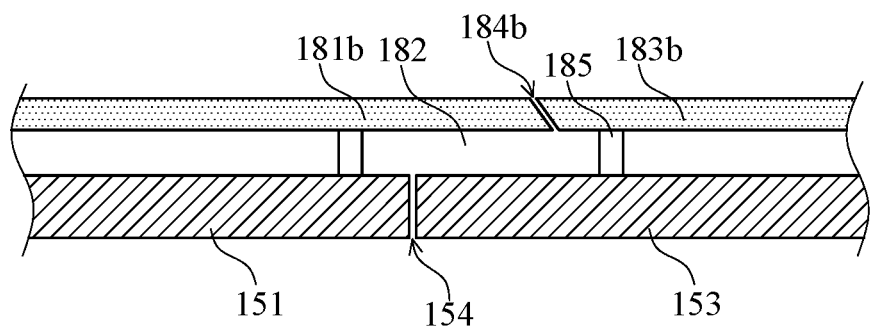
FIG. 9 is a schematic fragmentary sectional view illustrating two shield members and two guard plates of the shielding device which are operated in the shielding state, according to another different embodiment of the present disclosure.

Furthermore, as shown in FIG. 6 and FIG. 9, in another different embodiment of the present disclosure, both of the two shield members 151, 153 respectively have inner-edge surfaces, which are adjacent to face each other and form the first gap space 154b therebetween in the shielding state. Likewise, each of the two guard plates 181b, 183b also has the aforementioned top surface (upside of FIG. 9), a bottom surface (downside of FIG. 9) and an inner-edge surface which face each other to form the second gap space 184b therebetween.

In this embodiment, the inner-edge surfaces of two guard plates 181b, 183b are formed inclined relative to the top surface or the bottom surface thereof, and also substantially parallel to each other. With such structure, when the two shield members 151, 153 are operated into the shielding state, the inner-edge surfaces of the two guard plates 181b, 183b face each other and form the second gap space 184b in an inclined manner relative to the first gap space 154 between the two shield members 151, 153, such that to tilt away from the second gap space 184b for preventing the pollutant from passing through and entering the first gap space 354, in a more effective manner.

Surely, in other different embodiment, the two shield members 151, 153 may also be configured to have the inner-edge surfaces thereof formed in the inclined, substantially parallel manner, such that to further orient both of the first gap space and the second gap space to tilt away from each other, for a further effective performance against the falling pollutants.

In this embodiment, the inner-edge surfaces of the shield members 151, 153 are formed in a straight and flat manner, so do the inner-edge surfaces of the guard plates 181, 184. However, the present disclosure is not limited thereto, in other embodiment, the inner-edge surfaces of the shield members 151, 153 may be formed in concave and convex shapes or zig-zag shapes but still corresponding to each other, so do the inner-edge surfaces of the guard plates 181, 184.

Figure 10:
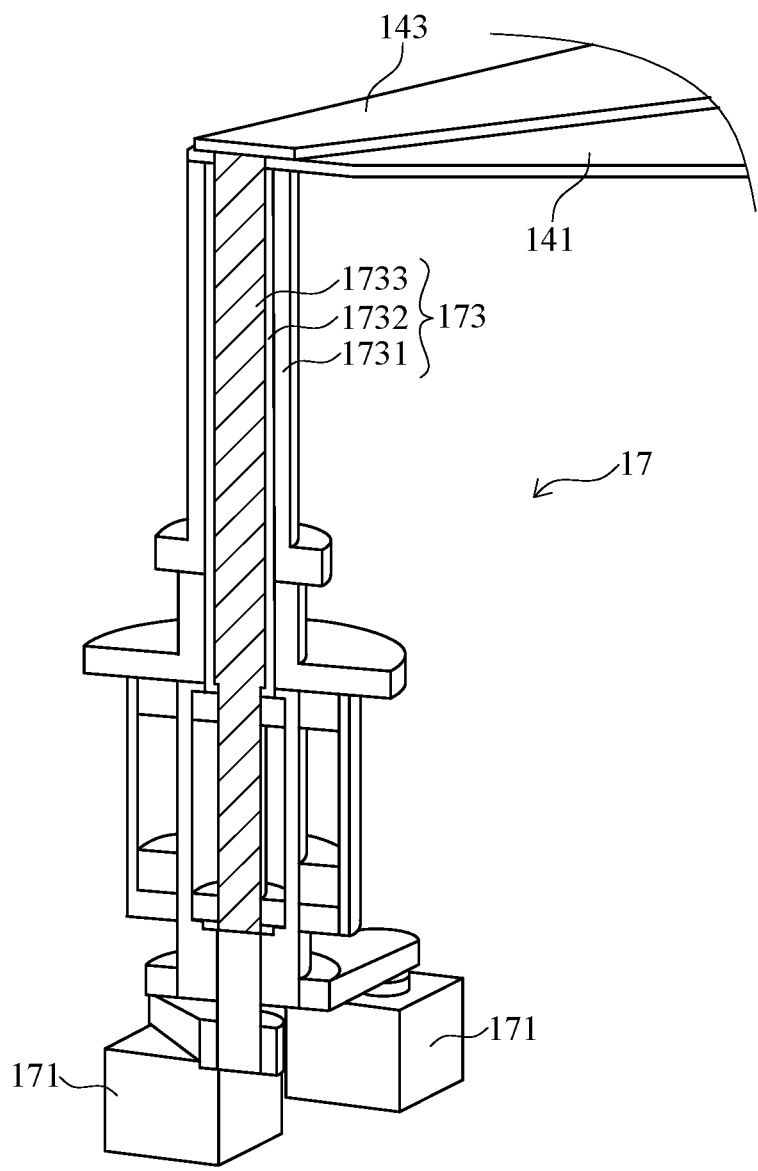
FIG. 10 is a schematic perspective sectional view illustrating a driver of the shielding device, according to one embodiment of the present disclosure.

In one embodiment of the present disclosure as shown in FIG. 10, the driver 17 includes at least one motor 171 and a shaft seal 173, wherein the motor 171 is connected to the first-shield member 151 and the second-shield member 153 via the shaft seal 173. The motor 171 is positioned outside of the containing space 12 within the reaction chamber 11. The shaft seal 173 extends from the motor 171 and into the reaction chamber 11, and hence partially disposed within the containing space 12.

Specifically, the shaft seal 173 includes an outer tube 1731 and a main shaft 1733. The outer tube 1731 has an inner space 1732 for containing the main shaft 1733, wherein the outer tube 1731 and the main shaft 1733 are disposed concentrically. Moreover, the outer tube 1731 and the main shaft 1733 can be driven by the motor 171 to rotate relative to each other. The outer tube 1731 is connected to the first-connecting arm 141, and such that able to swing the first-connecting arm 141 to hence move the first-shield member 151. The main shaft 1733 is connected to the second-connecting arm 143, and such that able to swing the second-connecting arm 143 to hence move the second-shield member 153.

The shaft seal 173 may be a common shaft seal component, which is mainly for isolating the containing space 12 of the reaction chamber 11 from an outside thereof and maintaining a vacuum condition within the containing space 12. In a different embodiment of the present disclosure, the shaft seal 173 may be a magnetic liquid rotary sealing, which includes a plurality of bearings, at least one permanent magnet, at least one pole piece and at least one ferrofluid.

In one embodiment of the present disclosure as shown in FIG. 10, the motor 171 may be two respectively connected to the outer tube 1731 and the main shaft 1733 of the shaft seal 173, to drive the outer tube 1731 and the main shaft 1733 to rotate in opposite directions, such that to swing and move the first-shield member 151 and the second-shield member 153 in the opposite directions via the outer tube 1731 and the main shaft 1733.

In a different embodiment of the present disclosure, the motor 171 may be just one with a drive mechanism (e.g. gear system or linkage system, etc.), such that to drive, swing the first-connecting arm 141 and the second-connecting arm 143 and to further move the first-shield member 151 and the second-shield member 153 in the opposite directions.

In more detail, the thin-film-deposition equipment 10 and/or the shielding device 100 according to the present disclosure, which can be operated to switch between two states as the open state and the shielding state. As shown in FIG. 2, the driver 11 can drive, swing the first-shield member 151 and the second-shield member 153 to leave each other and move into the open state. In the open state, the first-shield member 151 and the second-shield member 153 have an open space 152 therebetween, such that the first-shield member 151 and the second-shield member 153 do not get between the target material 161 and the carrier 13 with the substrate 163 thereon.

When the first-shield member 151 and the second-shield member 153 are operated into the open state, the carrier 13 can be driven by the elevating unit to approach the target material 161. Thereafter, a process gas (e.g. noble gas) is employed to bombard the target material 161, in order to remove and deposit particles (e.g. atoms or molecules) of the target material 161 and form a thin film on a surface of the substrate carried on the carrier 13.

In a different embodiment of the present disclosure as shown in FIG. 1, the containing space 12 of the reaction chamber 11 may be disposed with a tubular blocking member 111, which has one end connected to the ceiling surface of the reaction chamber 11, and another end formed with an opening 112. Such that, when the carrier 13 approaches the target material 161, the carrier 13 also enters the opening 112 or contacts the blocking 111. The reaction chamber 11, the carrier 13 and the blocking member 111 together define a reactive space within the containing space 12, for forming the thin film on the substrate within the reactive space, such that to prevent the blew-off particles of the target material 161 from spreading out of the reactive space and forming undesired thin film outside.

Figure 12:
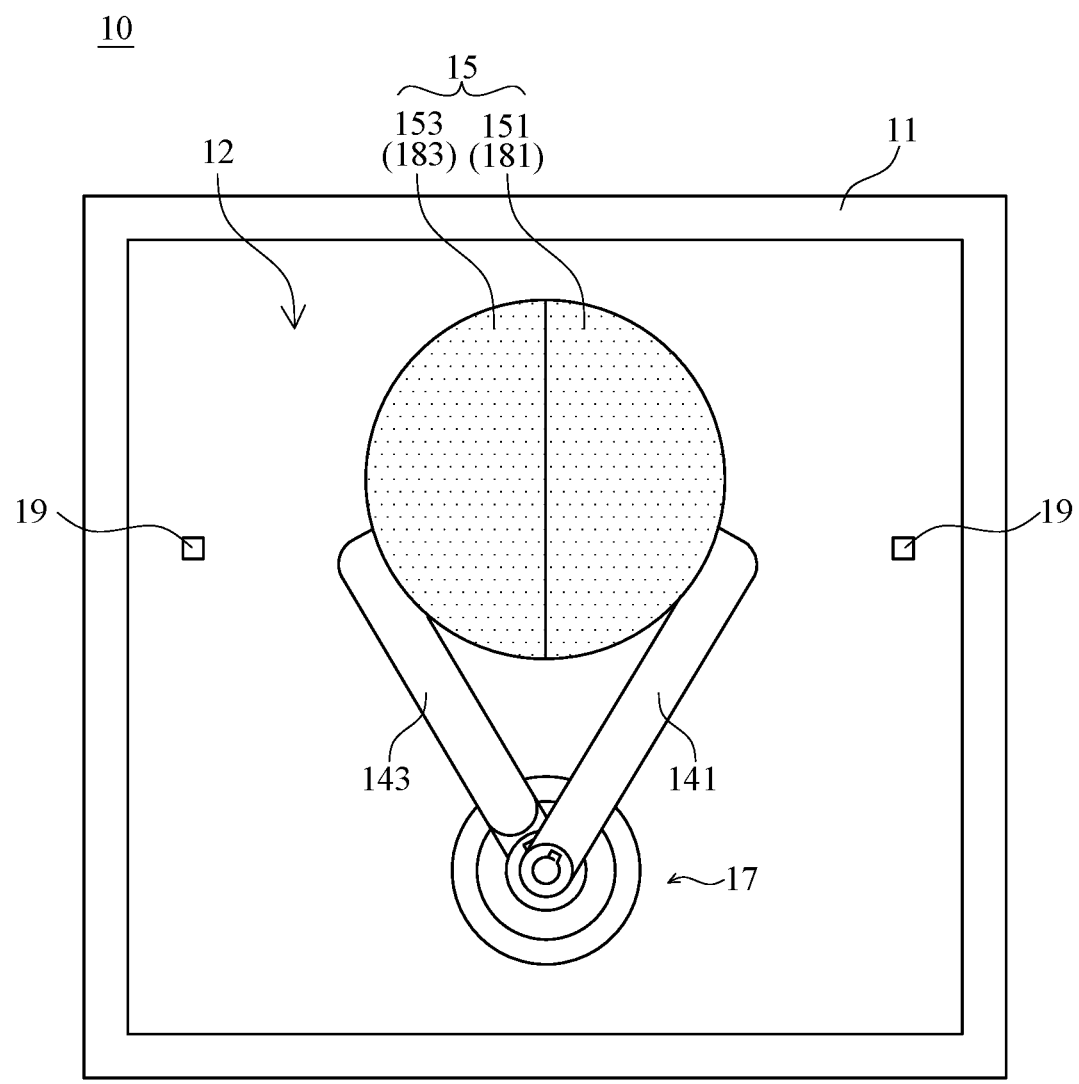
FIG. 12 is a schematic top view illustrating the shielding device of the thin-film-deposition equipment which is in the shielding state, according to one embodiment of the present disclosure.

In the opposite manner, as shown in FIG. 3 and FIG. 12, the driver 17 can drive, swing the first-shield member 151 and the second-shield member 153 to approach each other and move into the shielding state. In the shielding state, the first-shield member 151 and the second-shield member 153 come together and form the whole shield 15 between the target material 161 and the carrier 13, such that to cover and shield the carrier 13 from the target material 161.

As shown in FIG. 1, the shield 15 and the blocking member 111 together can define a cleaning space 121 within the containing space 12, wherein the cleaning space 121 and the aforementioned reactive space have partially or completely spatial overlap. A burn-in process may be performed within the cleaning space 121, to clean the target material 161, the ceiling surface of the reaction chamber 11 and/or an inside of the blocking member 111, and to remove oxides, nitrides or other pollutants on the target material 161, also to remove undesired, waste thin film within the reaction chamber 11 and/or the blocking member 111.

Figure 11:
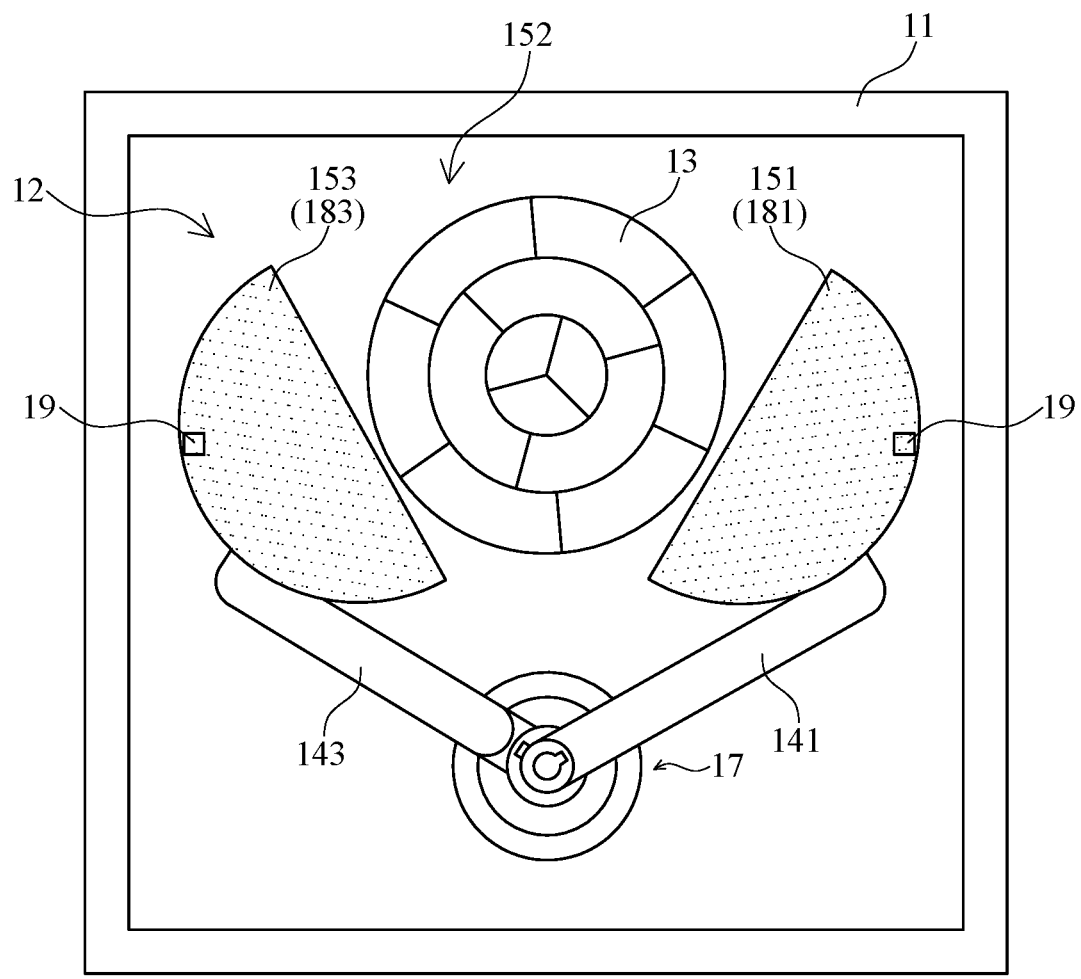
FIG. 11 is a schematic top view illustrating the shielding device of the thin-film-deposition equipment which in the open state, according to one embodiment of the present disclosure.

In one embodiment of the present disclosure as shown in FIG. 11 and FIG. 12, the reaction chamber 11 and/or the containing space 12 may be configured to have a relatively large size, which is sufficient for accommodating the two shield members 151, 153 in the open state, therefore no need of additional containers for storing the shield members 151, 153.

In one embodiment of the present disclosure, the reaction chamber 11 may be further disposed with a plurality of position sensors 19 (e.g. optical sensors) within the containing space 12, for respectively detecting locations the first-shield member 151 and the second-shield member 153. The position sensors 19 are configured to confirm that the first-shield member 151 and the second-shield member 153 are in the open state, thereby to avoid undesired interference, collisions between those movable components as the two connecting arms 141, 143 and the two shield members 151, 152 and the carrier 13.

In practical use, according to how the other components, mechanisms and movements thereof in the thin-film-deposition equipment 10 are arranged, the shielding device 100 may be disposed at different locations within the reaction chamber 11. For this embodiment as shown in FIG. 11 and FIG. 12, as the containing space 12 of the reaction chamber 11 is substantially formed with a rectangular cross-section, the driver 17 of the shielding device 100 may be disposed at a side of the reaction chamber 11 and/or the containing space 12. Alternatively, in other embodiments (similar to an embodiment of FIG. 13), the driver 17 of the shielding device 100 may be disposed on or near by a corner of the reaction chamber 11 and/or the containing space 12, such that the reaction chamber 11 can be further disposed with substrate passages or gas-extraction pipelines (not shown) at lateral sides thereof.

Figure 13:
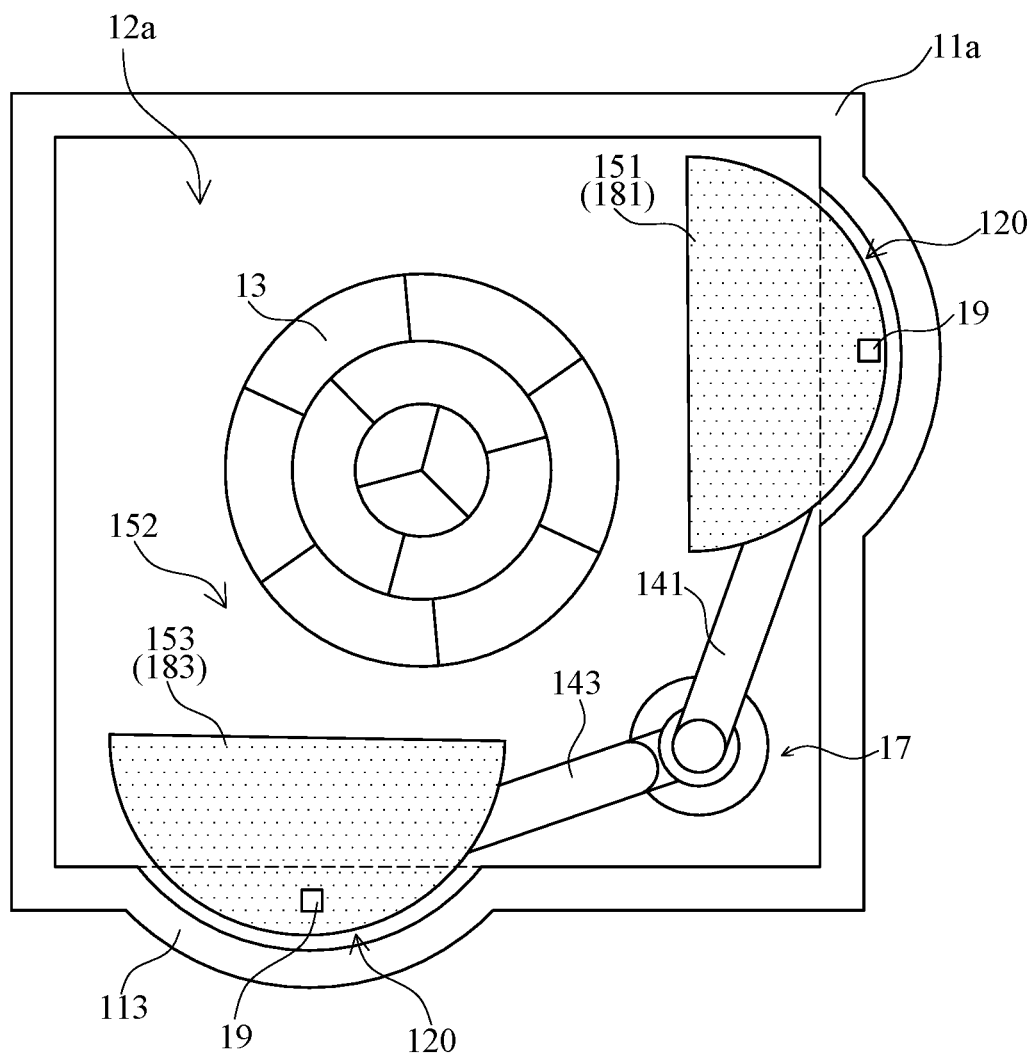
FIG. 13 is a schematic top view illustrating the shielding device of the thin-film-deposition equipment which in is the open state, according to a different embodiment of the present disclosure.

In the embodiment as shown in FIG. 13, the reaction chamber 11a may be respectively disposed with two sensor areas 113 which are respectively connected to two sides thereof, wherein each of the sensor areas 113 has a height shorter than that of the reaction chamber 11a. Furthermore, each of the sensor areas 113 is formed with a sensing space 120 therein which is spatially and fluidly connected to the containing space 12 of the reaction chamber 11a, for partially containing the first-shield member 151 and the second-shield member 153 respectively when the two shield members 151 are operated into the open state. Also to mention that when in the open state, each of the first-shield member 151 and the second-shield member 153 has a relatively small portion within the corresponding sensing space 120, and relatively large portion remaining within the containing space 12.

Moreover, each of the sensing spaces 120 of the sensor areas 113 are disposed with at least one position sensor 19, for respectively detecting and confirming that the two shield members 151, 153 have entered the sensing spaces 120 and in the open state. Also to mention that in this embodiment, the driver 17 is disposed on or near by a corner of the reaction chamber 11 and/or the containing space 12, and the two sensor areas 113 are respectively disposed on two adjacent sides of the reaction chamber 11, to facilitate disposing substrate passages or gas-extraction pipelines on the reaction chamber 11. However surely, in other different embodiment, the driver can be configured to dispose on a side of the reaction chamber 11 and/or the containing space 12, and the two sensor areas can be respectively disposed on two opposite sides of the reaction chamber 11.

Figure 14:
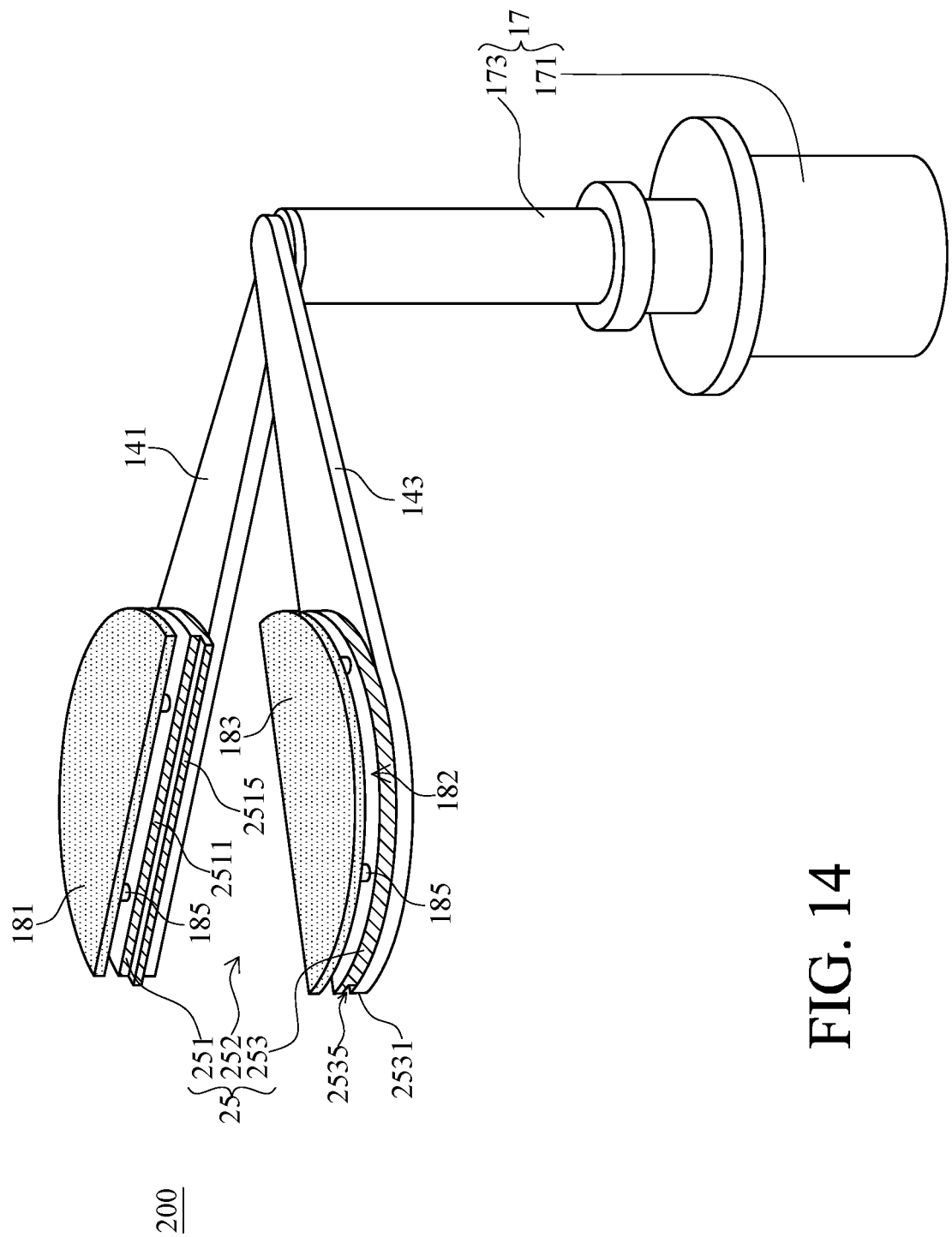
FIG. 14 is a schematic perspective view illustrating the shielding device of the thin-film-deposition equipment which is in the open state, according to yet another embodiment of the present disclosure.

Referring to FIG. 14, which is a schematic perspective view illustrating the shielding device 200 of the thin-film-deposition equipment which is in the open state, according to another embodiment of the present disclosure. The double-layer shielding device 200 in this embodiment is similar to that in aforementioned embodiments, but different in structures of the first-shield member 251 and the second-shield member 253. The first-shield member 251 has a first-inner-edge surface 2511 and a second-inner-edge surface 2531 (similar to the aforementioned inner-edge surfaces in the embodiments of FIG. 7~FIG. 9), wherein the first-inner-edge surface 2511 is formed with at least one protrusion 2515, in the other hand, the second-inner-edge surface 2531 is formed with at least one cavity 2535. Furthermore, the protrusion 2515 on the first-inner-edge surface 2511 corresponds to the cavity 2535 on the second-inner-edge surface 2531, and the protrusion 2515 is formed slightly smaller than the cavity 2535.

Also to mention that in this embodiment, the protrusion 2515 is positioned at middle of the first-inner-edge surface 2511 on the first-shield member 251, the cavity 2535 is also positioned at middle of the second-inner-edge surface 2531 on the second-shield member 253. However, in another different embodiment, the protrusion 2515 may be positioned at an upper portion of the first-inner-edge surface 2511 of the first-shield member 251, and the cavity 2535 may also be positioned at an upper portion of the second-inner-edge surface 2531.

Furthermore, in this embodiment, when the first-shield member 251 and the second-shield member 253 are operated in the shielding state, between the first-shield member 251 and the second-shield member 253, the first-inner-edge surface 2511 and the second-inner-edge surface 2531 are adjacent to each other and maintain the first gap space 254, meanwhile, the protrusion 2515 on the first-inner-edge surface 2511 enters the cavity 2535 on the second-inner-edge surface 2531 but still maintain the gap space 254, and thus no contact therebetween.

Similar to the aforementioned embodiment, the first gap space 254 between the first-inner-edge surface 2511 and the second-inner-edge surface 2531 is configured less than the aforementioned threshold value, such as 1 mm. Thereby, the first-shield member 251 and the second-shield member 253 do not contact each other, nor the protrusion 2515 and the cavity 2535 thereon, in order prevent the collision or friction therebetween.

Also, similar to the aforementioned embodiment, the first-shield member 251 and the second-shield member 253 are formed as half-round plates, with straight and flat inner-edge surfaces 2512, 2532. However, the present disclosure is mot limited thereto, in other embodiment, the inner-edge surfaces may be formed in concave and convex shapes or zig-zag shapes, or even inclined planes but still corresponding to each other.

Figure 15:
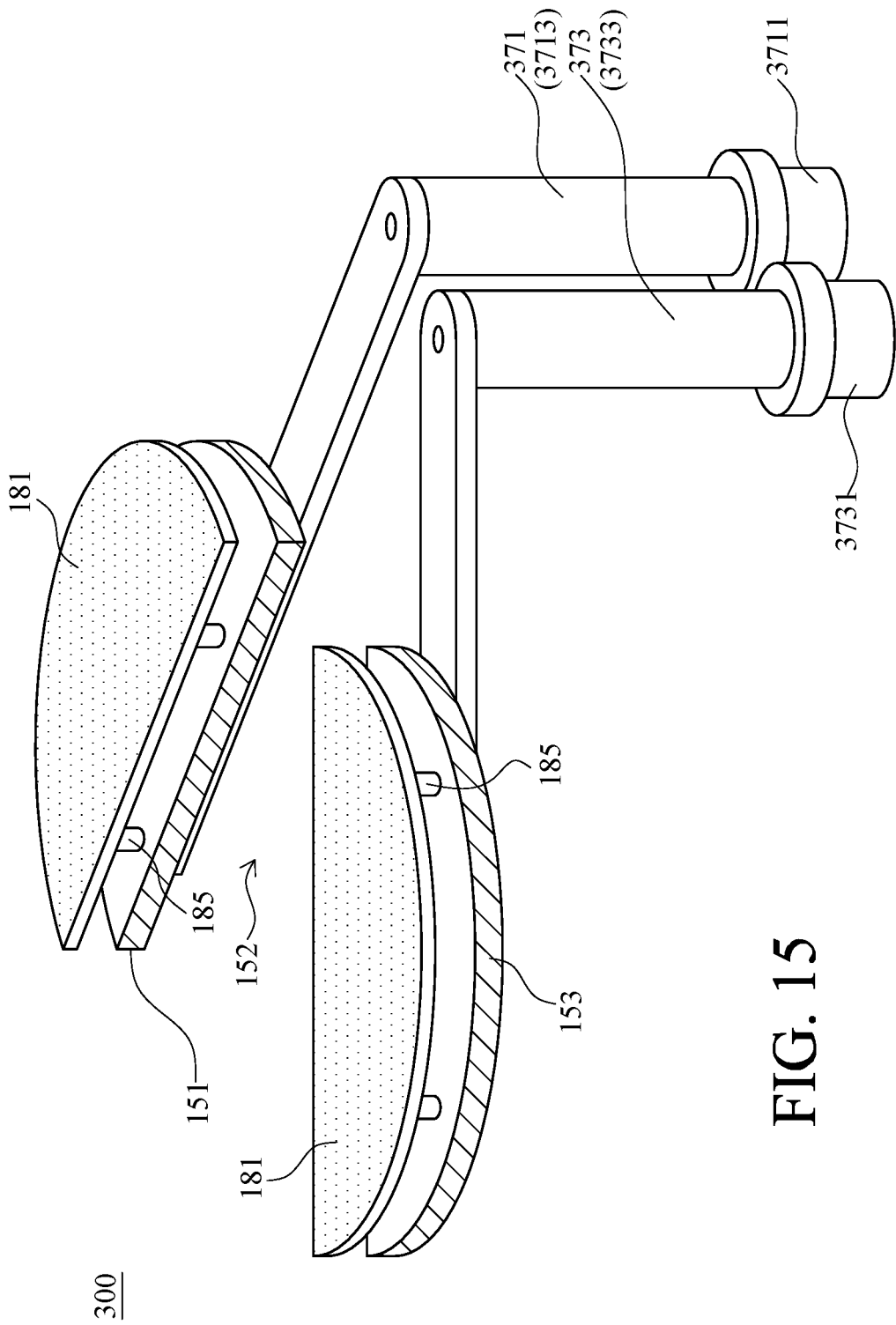
FIG. 15 is a schematic perspective view illustrating the shielding device of the thin-film-deposition equipment which is in the open state, according to one more embodiment of the present disclosure.

Referring to FIG. 15, which is a schematic perspective view illustrating the shielding device 300 of the thin-film-deposition equipment which is in the open state, according to one more embodiment of the present disclosure. In comparison with the aforementioned embodiment, the driver 37 in this embodiment is configured as a first driver 371 and a second driver 373. The first driver 371 and the second driver 373 are respectively connected power-transmittably to the first-shield member 151 and the second-shield member 153, such that to drive and swing the first-shield member 151 and the second-shield member 153 to move in the opposite directions. For example, the first-shield member 151 and the second-shield member 153 may synchronously sway in the opposite directions, respectively about an axle of the first driver 371 and an axle of the second driver 373.

To be specific, the first driver 371 and the second driver 373 can respectively drive, swing the first-shield member 151 and the second-shield member 153 to move away from each other into the open state, or to move toward each other into the shielding state.

In one embodiment of the present disclosure, the first driver 371 and the second driver 373 respectively include motors 3711, 3731 and shaft seals 3713, 3733, which are structures similar to the aforementioned motor 171 and shaft seal 173.

Also similar to the aforementioned embodiments, in practical use, the first driver 371 and the second driver 373 may be connected to the first-shield member 151 and the second-shield member 153, respectively via the first-connecting arm 141 and the second-connecting arm 143.

Surely, the first driver 371 and the second driver 373 may be configured to respectively connect to and drive the aforementioned first-shield member 251 and the second-shield member 252 formed with the protrusion 2515 and the cavity 2535, to switch between the open state and the shielding state as well.

Moreover, in other embodiment, the two drivers 371, 373 may be disposed at or near by a corner of the containing space 12 or the reaction chamber 11, such that to allow the passage for the substrate or the gas-extraction pipeline disposed at the edge side of the containing space 12 or the reaction chamber 11.

The above disclosure is only the preferred embodiment of the present disclosure, and not used for limiting the scope of the present disclosure. All equivalent variations and modifications on the basis of shapes, structures, features and spirits described in claims of the present disclosure should be included in the claims of the present disclosure.

We claim:

1. A thin-film-deposition equipment, comprising:
   a reaction chamber comprising a containing space;
   a carrier disposed within the containing space for carrying at least one substrate thereon; and
   a shielding device comprising:
      a first-shield member that is disposed within the containing space;
      a first-guard plate that is disposed on a surface of the first-shield member;
      a second-shield member that is disposed within the containing space;
      a second-guard plate that is disposed on a surface of the second-shield member; and
      a driver that interconnects and drives the first-shield member and the second-shield member to respectively sway and move the first-shield member and the second-shield member in opposite directions between an open state and a shielding state, wherein in the shielding state, the first-shield member and the second-shield member approach each other to cover the carrier, therewith the first-guard plate and the second-guard plate also approach each other to cover the first-shield member and the second-shield member.

2. The thin-film-deposition equipment according to claim 1, wherein the driver comprises a shaft seal and at least one motor, and the at least one motor is connected to the first-shield member and the second-shield member via the shaft seal.

3. The thin-film-deposition equipment according to claim 2, wherein the shaft seal comprises an outer tube and a main shaft; the outer tube has an inner space for containing the main shaft; the at least one motor is connected to the first-shield member via the outer tube, and connected the second-shield member via the main shaft.

4. The thin-film-deposition equipment according to claim 1, further comprising a target material that is disposed within the containing space of the reaction chamber to face the carrier, wherein in the shielding state, the first-shield member and the second-shield member are positioned between the target material and the carrier, therewith the first-guard member and the second-guard member are positioned between the first-shield member and the second-shield member and the target material.

5. The thin-film-deposition equipment according to claim 1, wherein in the shielding state, the first-shield member and the second-shield member have a first gap space therebetween; the first-guard plate and the second-guard plate have a second gap space therebetween; and the first gap space and the second gap space do not spatially overlap.

6. The thin-film-deposition equipment according to claim 5, wherein the shielding device has the first-guard plate formed with an area size larger than that of the second-guard plate, or has the first-shield member formed with an area size larger than that of the second-shield member.

7. The thin-film-deposition equipment according to claim 5, wherein in the shielding state, the first-guard plate and the second-guard plate form the second gap space in an inclined manner relative to the first gap space.

8. The thin-film-deposition equipment according to claim 1, further comprising two sensor areas connected to the reaction chamber, wherein each of the sensor areas is formed with a height shorter than that of the reaction chamber; each of the sensor areas has a sensing space fluidly connected to the containing space of the reaction chamber for respectively and partially containing the first-shield member and the second-shield member in the open state; and each of the sensor areas is disposed with at least one position sensor for detecting the first-shield member and the second-shield member within the sensing spaces of the sensor areas.

9. The thin-film-deposition equipment according to claim 1, wherein the first-shield member is positioned higher than the second-shield member; the first-guard member is positioned higher than the second-guard member; and in the shielding state, the first-shield member partially covers the surface of the second-shield member, the first-guard member partially covers a top of the second-guard member.

10. The thin-film-deposition equipment according to claim 1, wherein the first-shield member of the shielding device comprises a first-inner-edge surface formed with at least one protrusion; the second-shield member of the shielding device comprises a second-inner-edge surface formed with at least one cavity; and in the shielding state, the at least one protrusion on the first-inner-edge surface of the first-shield member enters the at least one cavity on the second-inner-edge surface of the second-shield member.

11. The thin-film-deposition equipment according to claim 1, wherein the driver comprises a shaft seal, a first driver and a second driver; the shaft seal comprises an outer tube and a main shaft; the first driver is connected to the first-shield member via the outer tube; and the second driver is connected to the second-shield member via the main shaft.

12. The thin-film-deposition equipment according to claim 1, wherein the driver comprises two shaft seals and two motors; and the two motors are connected to the first-shield member and the second-shield member respectively via the two shaft seals.

13. A double-layer shielding device adapted to a thin-film-deposition equipment, comprising:
   a first-shield member;
   a first-guard plate disposed on a surface of the first-shield member;
   a second-shield member;
   a second-guard plate disposed on a surface of the second-shield member; and
a driver that interconnects and drives the first-shield member and the second-shield member to respectively sway and move the first-shield member and the second-shield member in opposite directions between an open state and a shielding state, wherein in the shielding state, the first-shield member and the second-shield member approach each other, therewith the first-guard plate and the second-guard plate also approach each other to cover the first-shield member and the second-shield member.

14. The double-layer shielding device according to claim 13, wherein the driver comprises a shaft seal and at least one motor, and the at least one motor is connected to the first-shield member and the second-shield member via the shaft seal.

15. The double-layer shielding device according to claim 13, wherein in the shielding state, the first-shield member and the second-shield member have a first gap space therebetween; the first-guard plate and the second-guard plate have a second gap space therebetween; and the first gap space and the second gap space do not spatially overlap.

16. The double-layer shielding device according to claim 15, which has the first-guard plate formed with an area size larger than that of the second-guard plate, or which has the first-shield member is formed with an area size larger than that of the second-shield member.

17. The double-layer shielding device according to claim 15, wherein in the shielding state, the first-guard plate and the second-guard plate form the second gap space in an inclined manner relative to the first gap space.

18. The double-layer shielding device according to claim 13, wherein the first-shield member comprises a first-inner-edge surface formed with at least one protrusion; the second-shield member comprises a second-inner-edge surface formed with at least one cavity; and in the shielding state, the at least one protrusion on the first-inner-edge surface of the first-shield member enters the at least one cavity on the second-inner-edge surface of the second-shield member.

19. The double-layer shielding device according to claim 13, wherein the driver comprises a shaft seal, a first driver and a second driver; the shaft seal comprises an outer tube and a main shaft; the first driver is connected to the first-shield member via the outer tube; and the second driver is connected to the second-shield member via the main shaft.

20. The double-layer shielding device according to claim 13, wherein the driver comprises two shaft seals and two motors; and the two motors are connected to the first-shield member and the second-shield member respectively via the two shaft seals.

* * * * *